United States Patent [19]

Liken et al.

[11] Patent Number: 4,986,778
[45] Date of Patent: Jan. 22, 1991

[54] CARRIER FOR USE IN TESTING CIRCUIT BOARDS

[75] Inventors: Peter A. Liken, West Olive; Steven B. Ensing, Holland, both of Mich.

[73] Assignee: 501 Venturdyne, Ltd., West Allis, Wis.

[21] Appl. No.: 347,468

[22] Filed: May 4, 1989

[51] Int. Cl.$^5$ .......................... H01R 9/09; H05K 7/10
[52] U.S. Cl. .................................. 439/74; 324/158 F
[58] Field of Search ..................... 439/59–62, 439/64, 65, 74, 75, 76; 361/412, 413, 393, 394, 395, 396, 399; 324/158 F

[56] References Cited

U.S. PATENT DOCUMENTS

| | | | |
|---|---|---|---|
| 3,340,439 | 9/1967 | Henschen et al. | 439/69 |
| 3,678,385 | 7/1972 | Bruner | 324/158 F |
| 4,226,491 | 10/1980 | Kazama | 361/399 |
| 4,520,426 | 5/1985 | Wessely | 361/412 |
| 4,530,554 | 7/1985 | Velsher et al. | 439/62 |
| 4,560,216 | 12/1985 | Egawa | 324/158 F |
| 4,733,461 | 3/1988 | Nakano | 361/412 |
| 4,840,570 | 6/1989 | Mann, Jr. et al. | 361/413 |
| 4,862,076 | 8/1989 | Renner et al. | 324/158 F |

OTHER PUBLICATIONS

Electronics, Stacked Cards, by S. Langham, p. 139, 2-24-1982.

Primary Examiner—Neil Abrams
Attorney, Agent, or Firm—Michael, Best & Friedrich

[57] ABSTRACT

A carrier for use in testing circuit boards includes a carrier frame adapted to be mounted vertically within a test chamber and a plurality of circuit board mounting modules for supporting at least one circuit board. The circuit board carrier frame has a plurality of vertically oriented module supports provided thereon and each of the circuit board mounting modules is constructed and arranged to be releasably mounted in one of the module supports. A first electrical connector assembly is mounted on the carrier frame for being connected to a source of electrical energy and test signals and a plurality of second electrical connector assemblies are each connected in circuit with the first electrical connector assembly and are located respectively adjacent the module supports and a third electrical connector assembly is mounted on each of the modules and each is adapted to be connected to one of the second electrical connector assemblies. A plurality of electrical contacts are located on the circuit board mounting modules for engaging individual portions of the circuit board to provide energy and control signals thereto and releasable retainers are pivotally mounted on each module for securing individual circuit boards in the module and in engagement with the electrical contacts.

25 Claims, 2 Drawing Sheets

CARRIER FOR USE IN TESTING CIRCUIT BOARDS

BACKGROUND OF THE INVENTION

This invention relates to apparatus for use in testing circuit boards and more particularly to a universal circuit board carrier which can be used with circuit boards having different circuitry.

Electric circuit boards are commonly tested or "burned in" prior to installation in the electrical apparatus in which they are to be used. The burning in process comprises subjecting the circuit boards to a plurality of electric duty cycles while subjecting the boards to varying environmental conditions. The burning in procedure is commonly done in a test chamber which includes means for controlling the temperature, humidity and air flow within the chamber and electrical connectors for suitably energizing and providing test signals to circuit boards being tested. Carriers support the individual circuit boards in a parallel spaced-apart relation within the test cell and include electrical connectors for engaging the circuit boards and mating connectors mounted in the test cell. Because specific electrical connections are required to each circuit board and because different board designs require different test signals so that their duty cycles can be performed, it was necessary to provide different carriers for each specific circuit board design.

SUMMARY OF THE INVENTION

It is an object of the invention to provide a new and improved carrier for mounting circuit boards undergoing testing in the test cell.

Another object of the invention is to provide a circuit board carrier which may be employed with circuit boards having different circuit designs.

A further object of the invention is to provide a circuit board carrier which is more economical to service and maintain than prior art carriers.

A still further object of the invention is to provide a carrier for circuit board testing which does not require substantially complete redesign in order to be used with new or revised circuit boards.

In general terms, the invention comprises a carrier for supporting a plurality of circuit boards during testing and being adapted to be mounted vertically within a test cell. The carrier includes a carrier frame and a plurality of circuit board mounting modules which are constructed and arranged for supporting at least one circuit board. The carrier frame includes a plurality of module supports and each module includes means for releasably engaging each frame support whereby a plurality of circuit board mounting modules may be releasably mounted on the carrier frame. First electrical connector means is mounted on the carrier frame and is adapted to couple with an electrical connector mounted in the test cell. One of a plurality of second electrical connectors are disposed adjacent each of the module supports and one of a third plurality of electrical connectors are mounted on each of the circuit board mounting modules, and means are provided for electrically connecting each of the third electrical connectors to one of the second electrical connectors.

BRIEF DESCRIPTION OF THE DRAWINGS

FIG. 3 is a fragmentary view illustrating how the carrier in FIGS. 1 and 2 is mounted; and FIG. 4 is a fragmentary sectional view showing a portion of the carrier illustrated in FIG. 1.

BRIEF DESCRIPTION OF THE PREFERRED EMBODIMENT

Figure 1:
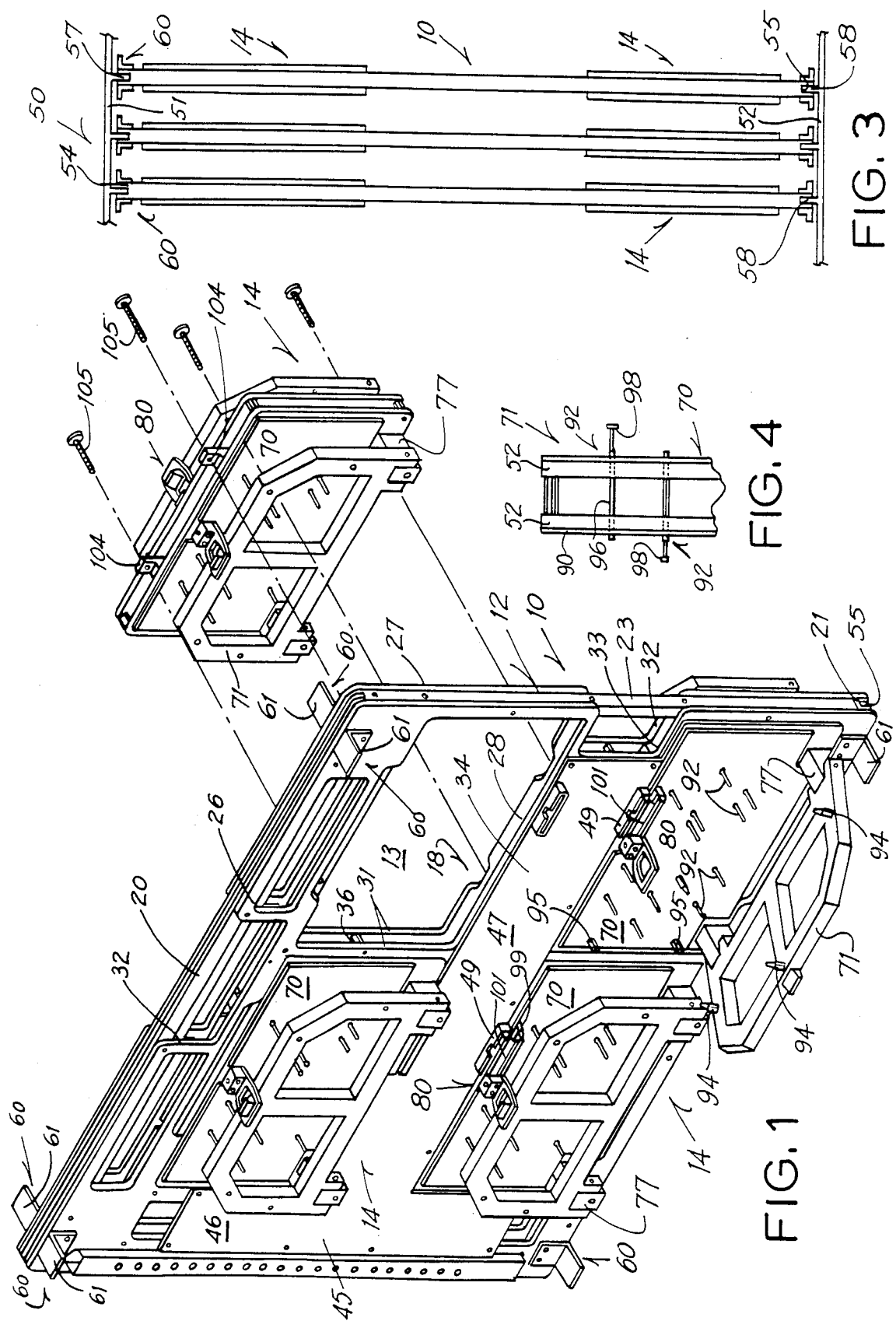
FIG. 1 is an exploded perspective view of the carrier according to the preferred embodiment of the invention and illustrating one side thereof.
Figure 2:
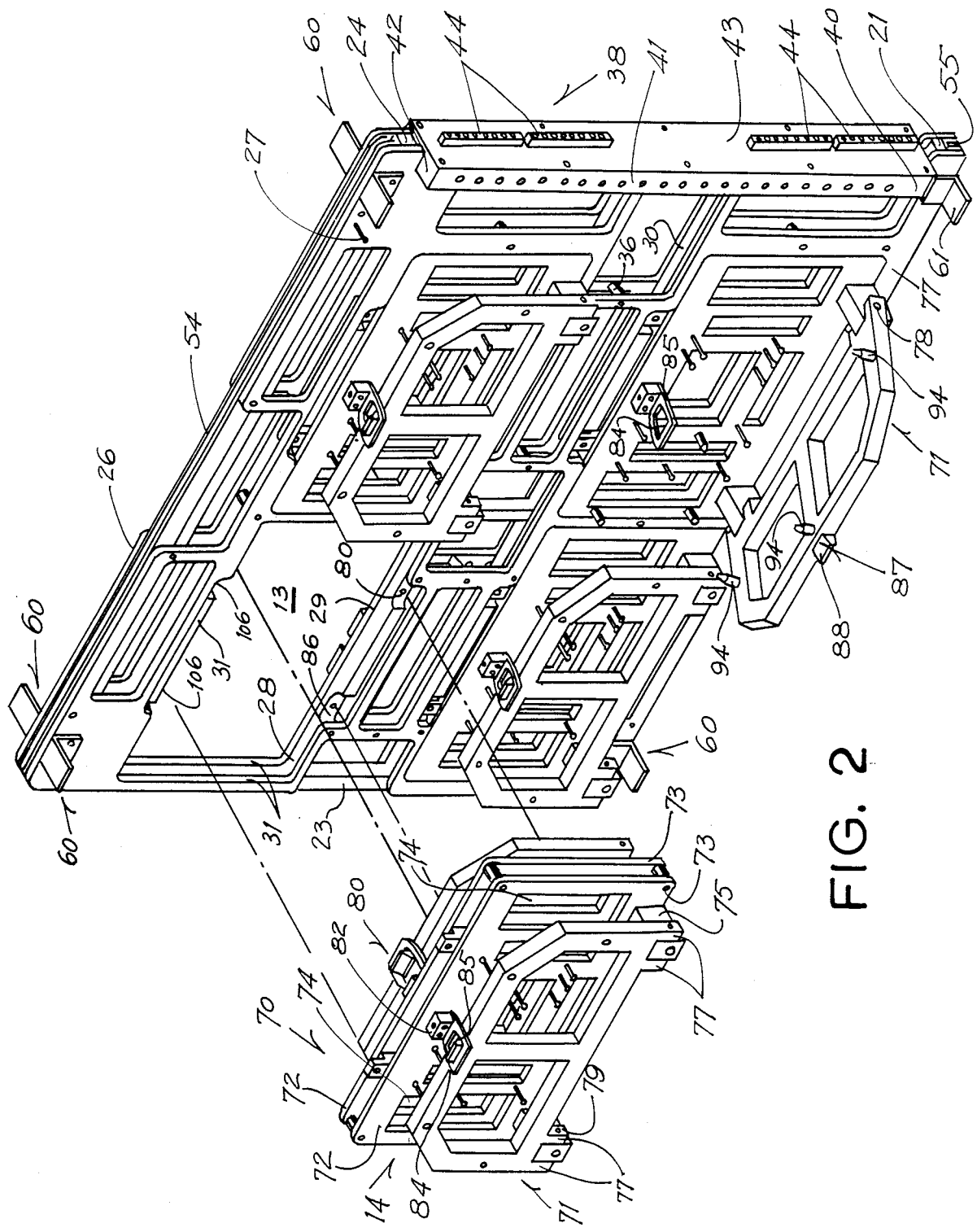
FIG. 2 is an exploded perspective view of the carrier illustrated in FIG. 1 and showing the opposite side thereof.

FIGS. 1 and 2 are perspective views of the circuit board carrier 10 in accordance with the preferred embodiment of the invention. Carrier 10 includes a carrier frame 12 having a plurality of rectangular windows 13 for receiving circuit board mounting modules 14.

The carrier frame 12 has a generally rectangular outer periphery and may be formed in any convenient manner. In the preferred embodiment, the carrier frame 12 includes elongate top and bottom frame members 20 and 21 and slightly shorter end frame members 23 and 24. Members 20, 21, 23 and 24 are joined in a rectangular array by side members 26 and 27 located on the opposite sides of carrier frame 12. There are also three cross members 28, 29 and 30 which extend between end members 23 and 24 and are mounted between side members 26 and 27 in general parallelism with the top and bottom members 20 and 21.

The side members 26 and 27 each have a plurality of rectangular openings 31 formed therein and which define the windows 13. In the preferred embodiment, there are four windows 16 in carrier 10 although any number can be used, depending upon the size of the circuit boards being tested. In addition, each side member 26 and 27 has recesses 32 and 33 in the central portion of its top and right side edges as viewed in FIG. 2. The members 20 and 23 and the recesses 32 and 33 cooperate to define top and front handles to facilitate carrying and manipulation of the carrier 10.

The side members 26 and 27 are complementary and are formed by relatively thin stringer sections which define a generally rectangular outer periphery and which frame the windows 13. The upper and lower margins of windows 13 are also framed by the cross members 28, 29 and 30. Members 26 and 27 are fixed to the members 20, 21, 23, 24, 28, 29 and 30 in any suitable manner, such as by screws 34, to define a rigid framework. In addition, there are a plurality of short spacers 36 which are fixed by screws 37 in a perpendicular relation between the side members 26 and 27 to maintain the side members in a parallel relationship and for additional support.

An electrical connector assembly 38 is secured to one end of the carrier 10 and to end member 24. In particular, connector assembly 38 includes an elongate, generally rectangular outer shell consisting of a hollow channel-shaped body 41 which is closed at its opposite ends by end closure members 42 and a cover plate 43 removably secured to the body 40 by screws. A plurality of pin-type socket connector modules 44 are mounted vertically on cover 41. In the preferred embodiment, there are four modules 44, one being associated with each window 13.

A pair of T-shaped face plates 45 are fixed to the side members 26 and 27 and each has a first portion 46 extending between the connector assembly 38 and the adjacent pair of windows 13 and a second portion 47 which extends from side to side and between the adjacent edges of the upper and lower windows 13. A hollow enclosure is thus defined by the members 45 and the adjacent side members 26 and 27 and the cross members 28 and 29. Mounted on each T-shaped member 45 are four electrical connector assemblies 49, with one being located adjacent an edge of each of the windows 13. Wiring (not shown) which extends between the connector modules 44 and the connectors 49 are accommodated within the enclosure defined by the members 47.

Those skilled in the art will appreciate that the carrier 10 is one of several that are adapted to be mounted within a basket-like structure 50 having upper and lower walls 51 and 52 and which in turn are mounted with other like baskets in a cart (not shown) adapted to be moved into and out of a test cell (not shown). The basket has a connector (not shown) adapted to be coupled to the connector modules 44 to provide electrical energy and test signals necessary to perform the circuit board duty cycle tests. In order to position the carrier 10 properly within the basket 50, longitudinal grooves 54 and 55 are formed in the top and bottom surfaces of members 20 and 21, respectively. The grooves 54 and 55 are sized to engage a pair of parallel rails 57 and 58 provided on the upper and lower walls 51 and 52 of basket 50. In addition, there is an L-shaped support foot 60 fixed at each corner of side members 26 and 27 and each foot has a laterally extending portion 61 for engaging the adjacent wall 51 or 52. This helps to maintain the carrier 10 in a vertical orientation and spaced from adjacent carriers.

It will be appreciated that the number of circuit board carrier modules 14 will correspond with the number of windows 13, that the windows 13 are identically configured and that the configuration of the outer peripheries of the circuit board mounting modules 14 are complementary to windows 13. Accordingly, each of the circuit board mounting modules 14 can be interchangeably received within any of the windows 13.

Each circuit board mounting module 14 includes a rectangular frame 70 having a thickness substantially equal to that of the carrier 12 and one of a pair of circuit board retainers 71 pivotally mounted on each of the opposite sides of frame 70. While frame 70 may be formed in any convenient manner, in the preferred embodiment it consists of a pair of identical, rectangular, flat skeletal frame members 72, each of which has a rectangular outer periphery 73 and a plurality of rectangular cut outs 74. The members 72 are joined in a parallel spaced-apart relation by spacers 75 which are fixed in any suitable manner at each corner.

A pair of hinge blocks 77 are fixed to and extends through the opposite sides of frame 70 with one being at each of the lower corners thereof. Pairs of spaced-apart hinge extensions 78 project downwardly from each lower corner of the circuit board retainers 71 and are disposed on the opposite sides of the protruding portions of hinge blocks 77. A hinge pin 79 extends through each pair of extensions 78 and their associated hinge block portions 77 whereby each circuit board retainer 71 is pivotally mounted on one side of its associated frame 70.

Each of the circuit board retainers 71 are pivotally mounted for movement between an open position as illustrated by the module at the lower right as viewed in FIG. 1 and a closed position shown by the remaining modules. Each retainer 51 can be latched in its closed Position by a latch assembly 80, one of which is located above each of the windows 13 and on the opposite sides of carrier 12. Each latch assembly 80 includes a block 82 fixed to the upper center portion of frame 70 and a resilient clip member 84 fixed to the lower surface of each block 82 and having a central opening 85. In addition, a wedge shaped catch 87 is fixed to the upper central peripheral portion of each circuit board retainer 71. Catches 87 each have an inclined surface 88 presented toward its associated clip member 84. When the circuit board retainers 71 are in their closed positions, their upper peripheral surfaces are generally parallel to and in close proximity with respect to the lower surface of the adjacent clip 84. Accordingly, when one of the circuit board retainers 71 is pivoted toward its closed position, the inclined surface 88 will flex the clip 84 upwardly and permit it to snap down over the back edge of catch 87 and thereby resiliently hold the retainer 71 in its closed position. The retainers 71 may be released by flexing its spring clip 84 upwardly to release catch 87.

A rectangular plate 90 is fixed to each of the opposite faces of each module frame 70 and each plate 90 has a plurality of resilient electrical contacts 92 distributed across its surface and extending perpendicularly therefrom. In addition, there are a first plurality of locating pins 94 mounted on the inner surface of each retainer 71 and extending perpendicularly therefrom and a second plurality of locating pins 95 mounted on and extending perpendicularly from the plates 90. Those skilled in the art will appreciate that when a circuit board is clamped by the retainers 70 and are properly positioned by the locating pins 94 and 95, the contacts 92 will engage correspondingly arrayed terminals on the circuit board whereby the circuit board may be provided with energy and control signals necessary to perform the duty cycle tests.

While the contacts 92 may take any convenient form, in the preferred embodiment each contact is shown in FIG. 4 to comprise a tubular support member 96 and a spring biased movable contact 98 slidably received within member 96. Electrical contact is provided when the circuit board (not shown) is pressed against the contact 98 thereby compressing the spring (not shown) within tube 96.

An electrical terminal assembly 99 is mounted on each plate 90 and is located immediately below one of the terminals 49 when the modules 14 are in position on carrier 12. A removable bus connector 101 electrically connects each of the terminal assemblies 49 and 99 and electrical conductors (not shown) within each module 14 connect contact 98 to terminal assembly 99 and other conductors (not shown) connect each terminal module 49 to one of the terminal modules 44. In this manner, an electrical circuit is established between terminal assemblies 44 and contact elements 78.

The modules 14 are releasably mountable in the windows 13 by means of brackets 104 which extend from the upper and lower edges of module 14 and are secured by screws 105 in recesses 106 formed in the cross members 28, 29, 30 and bottom member 21.

In practice, the carrier assembly 12 will have a universal wiring and contact arrangement so that it can be used with a wide variety of circuit boards. The modules 14, on the other hand, are each designed for a specific circuit board. Therefore, if the circuit board design changes or a new circuit board configuration is to be tested, it is only necessary to redesign the modules 14 rather than the entire carrier assembly.

It will also be appreciated that because the modules 14 are removable, servicing is facilitated because any malfunctioning or defective module can readily be replaced without removing the entire carrier from service. Furthermore, a removable module 14 permits different circuit board designs to be tested at the same time by employing different modules in a single carrier.

In operation, the individual modules 14 required for a particular circuit board design will be mounted on the carrier 12 by means of screws 105. The bus connectors 101 are then installed to connect terminal assemblies 49 to terminal assemblies 100. Thereafter, individual circuit boards are inserted into modules 14 and the retaining members 51 are closed and latched. After a circuit board has been mounted at each position, the carrier assembly 10 is then inserted into a basket along with other carriers after which the basket is inserted into the treatment chamber as is well known in the art.

The preferred embodiment shows provision for a single circuit board at each side of the modules 14. However, depending on the size of the circuit boards relative to the carrier, provision may be made for mounting more than one circuit board on each side of modules 14. This would require two retainers 14 and two sets of contacts 78 at each side.

While only a single embodiment of the invention has been illustrated and described, it is not intended to be limited thereby but only by the scope of the appended claims.

We claim:

1. A carrier for use in testing circuit boards includes a frame assembly and a plurality of circuit board mounting modules separable from the frame assembly, a plurality of module receiving means formed in said frame assembly and including means for individually receiving each of said modules, each of said module receiving means being identically constructed and arranged, said modules each being constructed and arranged complementary to the module receiving means whereby said modules may be interchangeably mounted in any of said module receiving means, securing means for securing said modules in said module receiving means, said modules each including retaining means for retaining individual circuit boards, and electrical connector means for connecting said circuit boards to a source of electrical energy and control signals exterior of said carrier assembly, said electrical connector means including a first electrical connector assembly mounted on the frame assembly for being connected to an external source of electrical energy, a plurality of identical second electrical connector assemblies each being in circuit with the first electrical connector assembly and one being located adjacent each of said module receiving means and a third electrical connector assembly mounted on each of the modules and each being adapted to be connected to any one of the second electrical connector assemblies, and contact means mounted on each module and dedicated to the specific circuitry of a circuit board to be mounted thereon, whereby circuit boards having different circuit designs can be mounted on different dedicated modules which may be received on any one of said module receiving means, and whereby said electrical connector means permits all of the circuit boards of different designs to be connected to an external source of energy or control signals so that the same carrier can be used for testing circuit boards of different designs.

2. The carrier set forth in claim 1 wherein each securing means includes a first part disposed on said frame assembly and adjacent each of said module receiving means and a second part mounted on each of said modules and adjacent the periphery thereof, each of said second parts being adopted to couple with any of said of first parts so that each of said modules may be releasably secured in any of said module receiving means.

3. The carrier set forth in claim 2 wherein the frame assembly is relatively flat, said modules each being relatively flat and having substantially the same thickness and said frame assembly and defining a pair of opposite sides, a retaining means disposed on each of the opposite sides of each module for retaining individual circuit boards, and electrical contact means on each of said opposite sides for engaging circuit boards mounted thereon.

4. The carrier set forth in claim 2 wherein each of said retaining means comprises a member pivotally mounted on said module for movement between open and closed positions and latching means for holding said retaining means in its closed position.

5. A carrier for use in testing circuit boards in a test cell, said carrier including a frame assembly and a plurality of circuit board mounting modules, said frame assembly having opposite sides, a plurality of openings formed in said frame assembly for individually receiving each of said modules, said opening extending through the opposite sides of said frame assembly and being identically configured, said modules each having an outer peripheral configuration complementary to the margins of the openings whereby said modules may be interchangeably mounted in any of said openings, said modules having a pair of opposite sides, securing means for securing said modules in said openings, said modules each including retaining means on each of its opposite sides for retaining an individual circuit board on each said side so that the individual circuit boards are exposed to the atmosphere in the test cell, and electrical connector means on each of the opposite sides of said modules for connecting each said circuit board to a source of electrical energy and control signals exterior of said carrier assembly.

6. The carrier set forth in claim 5 wherein said electrical connector means includes a first electrical connector assembly mounted on the frame assembly for being connected to an external source of electrical energy and test signals, a plurality of second electrical connector assemblies with each being in circuit with the first electrical connector assembly and one being located adjacent each of said module receiving means and a third electrical connector assembly mounted on each of the modules and each being adapted to be connected to one of the second electrical connector assemblies and contact means mounted on each module and adapted to engage the circuitry of a circuit board mounted thereon.

7. The carrier set forth in claim 6 wherein the frame assembly is relatively flat, said modules each being relatively flat and having substantially the same thickness as said frame assembly and defining a pair of opposite sides, a retaining means disposed on each of the opposite sides of the module for retaining individual circuit boards, and electrical contact means on each of said opposite sides for engaging circuit boards mounted thereon.

8. The carrier set forth in claim 5 wherein each of said openings is generally rectangular, each of said modules having a complementary rectangular outer periphery.

9. The carrier set forth in claim 8 wherein said electrical connector means includes a first electrical connector assembly mounted on the frame assembly for being connected to an external source of electrical energy and test signals, a plurality of second electrical connector assemblies with each being in circuit with the first electrical connector assembly and one being located adjacent each of said openings and a third electrical connector assembly mounted on each of the modules and each being adapted to be connected to one of the second electrical connector assemblies and contact means mounted on each module and adapted to engage the circuitry of a circuit board mounted thereon.

10. The carrier set forth in claim 8 wherein the first frame assembly is relatively flat, said modules each being relatively flat and having substantially the same thickness as said frame assembly and defining a pair of opposite sides, a retaining means disposed on each of the opposite sides of the module for retaining individual circuit boards, and electrical contact means on each of said opposite sides for engaging circuit boards mounted thereon.

11. A carrier for use in testing circuit boards includes a frame assembly and a plurality of circuit board mounting modules, a plurality of module receiving means formed in said frame assembly for including means for individually receiving each of said modules, each of said module receiving means comprising an opening formed in said frame assembly, each of said openings being identically configured, said modules each having an outer peripheral configuration complementary to the margins of the openings whereby said modules may be interchangeably mounted in any of said openings, securing means for securing said modules in said openings, each securing means including a first part disposed on said frame assembly and adjacent each of said openings and a second part mounted on each of said modules and adjacent the periphery thereof, each of said second parts being adapted to couple with any of said first parts so that each of said modules may be releasably secured in any of said openings, said modules each including retaining means for retaining individual circuit boards, and electrical connector means for connecting said circuit boards to a source of electrical energy and control signals exterior of said carrier assembly.

12. The carrier set forth in claim 11 wherein said electrical connector means includes a first electrical connector assembly mounted on the frame assembly for being connected to an external source of electrical energy and test signals, a plurality of second electrical connector assemblies with each being in circuit with the first electrical connector assembly and one being located adjacent each of said openings and a third electrical connector assembly mounted on each of the modules and each being adapted to be connected to one of the second electrical connector assemblies, and contact means mounted on each module and adapted to engage the circuitry of a circuit board mounted thereon.

13. The carrier set forth in claim 12 wherein the frame assembly is relatively flat, said modules each being relatively flat and having substantially the same thickness as said frame assembly and defining a pair of opposite sides, a retaining means disposed on each of the opposite sides of each module for retaining individual circuit boards, and electrical contact means on each of said opposite sides for engaging circuit boards mounted thereon.

14. The carrier set forth in claim 13 wherein each of said retaining means comprises a member pivotally mounted on said module for movement between open and closed positions and latching means for holding said retaining means in its closed position.

15. The carrier set forth in claim 14 wherein each of said openings is generally rectangular, each of said modules having a complementary rectangular outer periphery.

16. The carrier set forth in claim 11 wherein the frame assembly is relatively flat, said modules each being relatively flat and having substantially the same thickness as said frame assembly and defining a pair of opposite sides, a retaining means disposed on each of the opposite sides of each module for retaining individual circuit boards, and electrical contact means on each of said opposite sides for engaging circuit boards mounted thereon.

17. The carrier set forth in claim 11 wherein each of said retaining means comprises a member pivotally mounted on said module for movement between open and closed positions and latching means for holding said retaining means in its closed position.

18. The carrier set forth in claim 12 wherein each of said openings is generally rectangular, each of said modules having a complimentary rectangular outer periphery.

19. A carrier for use in testing circuit boards includes a frame assembly and a plurality of circuit board mounting modules, a plurality of module receiving means formed in said frame assembly for including means for individually receiving each of said modules, each of said module receiving means comprising an opening formed in said frame assembly, each of said openings being identically configured, said modules each having an outer peripheral configuration complementary to the margins of the openings whereby said modules may be interchangeably mounted in any of said openings, securing means for securing said modules in said openings, said modules each including retaining means for retaining individual circuit boards, electrical connector means for connecting said circuit boards to a source of electrical energy and control signals exterior of said carrier assembly, said frame assembly being relatively flat, said modules each being relatively flat and having substantially the same thickness as said frame assembly and defining a pair of opposite sides, a retaining means disposed on each of the opposite sides of each module for retaining individual circuit boards, and electrical contact means on each of said opposite sides for engaging circuit boards mounted thereon.

20. The carrier set forth in claim 19 wherein each of said openings is generally rectangular, each of said modules having a complimentary rectangular outer periphery.

21. The carrier set forth in claim 20 wherein each securing means includes a first part disposed on said carrier and adjacent each of said openings and a second part mounted on each of said modules and adjacent the periphery thereof, each of said second parts being adopted to couple with any of said of first parts so that each of said modules may be releasably secured in any of said openings.

22. The carrier set forth in claim 21 wherein said electrical connector means includes a first electrical connector assembly mounted on the frame assembly for being connected to an external source of electrical energy and test signals, a plurality of second electrical connector assemblies with each being in circuit with the first electrical connector assembly and one being located adjacent each of said openings and a third electrical connector assembly mounted on each of the modules and each being adapted to be connected to one of the second electrical connector assemblies and contact means mounted on each module and adapted to engage the circuitry of a circuit board mounted thereon.

23. A carrier for use in testing circuit boards includes a frame assembly and a plurality of circuit board mounting modules, a plurality of module receiving means formed in said frame assembly for including means for individually receiving each of said modules, each of said module receiving means comprising an opening formed in said frame assembly, each of said openings being identically configured, said modules each having an outer peripheral configuration complementary to the margins of the openings whereby said modules may be interchangeably mounted in any of said openings, securing means for securing said modules in said openings, said modules each including retaining means for retaining individual circuit boards, each of said retaining means comprising a member pivotally mounted on said module for movement between open and closed positions and latching means for holding said retaining means in its closed position, and electrical connector means for connecting said circuit boards to a source of electrical energy and control signals exterior of said carrier assembly.

24. The carrier set forth in claim 23 wherein each of said openings is generally rectangular, each of said modules having a complimentary rectangular outer periphery.

25. A carrier for use in testing circuit boards includes a frame assembly and a plurality of circuit board mounting modules, a plurality of module receiving means formed in said frame assembly and including means for individually receiving each of said modules, each of said module receiving means being identically configured, said modules each having an outer peripheral configuration complementary to the margins of the openings whereby said modules may be interchangeably mounted in any of said openings, securing means for securing said modules in said openings, said modules each including retaining means for retaining individual circuit boards, electrical connector means for connecting said circuit boards to a source of electrical energy and control signals exterior of said carrier assembly, said electrical connector means including a first electrical connector assembly mounted on the frame assembly for being connected to an external source of electrical energy and test signals, a plurality of second electrical connector assemblies each being in circuit with the first electrical connector assembly and one being located adjacent each of said openings and a third electrical connector assembly mounted on each of the modules and each being adapted to be connected to one of the second electrical connector assemblies, and contact means mounted on each module and adapted to engage the circuitry of a circuit board mounted thereon.

* * * * *

UNITED STATES PATENT AND TRADEMARK OFFICE
CERTIFICATE OF CORRECTION

PATENT NO. : 4,986,778
DATED : January 22, 1991
INVENTOR(S) : Peter A. Liken and Steven B. Ensing It is certified that error appears in the above-identified patent and that said Letters Patent is hereby corrected as shown below:

ON THE TITLE PAGE: Item [73]

The assignee's name should read --Venturedyne, Ltd.--

Claim 3, column 6, line 15, first "and" should be --as--.

Claim 11, column 7, line 29, first "for" should be --and--.

Claim 18, column 8, line 28, "complimentary" should be --complementary--.

Claim 20, column 8, line 56, "complimentary" should be --complementary--.

UNITED STATES PATENT AND TRADEMARK OFFICE
CERTIFICATE OF CORRECTION

PATENT NO. : 4,986,778
DATED : January 22, 1991
INVENTOR(S) : Peter A. Liken and Steven B. Ensing It is certified that error appears in the above-identified patent and that said Letters Patent is hereby corrected as shown below:

Claim 24, column 10, line 3, "complimentary" should be --complementary--.

Claim 25, column 10, line 10, after "means" and before "being", insert --comprising an opening formed in said frame assembly, each of said openings--.

Signed and Sealed this

Tenth Day of November, 1992

Attest:

DOUGLAS B. COMER

Attesting Officer

Acting Commissioner of Patents and Trademarks